United States Patent [19]

Chand

[11] Patent Number: 5,399,880

[45] Date of Patent: Mar. 21, 1995

[54] PHOTOTRANSISTOR WITH QUANTUM WELL BASE STRUCTURE

[75] Inventor: Naresh Chand, Berkeley Heights, N.J.

[73] Assignee: AT&T Corp., Murray Hill, N.J.

[21] Appl. No.: 104,969

[22] Filed: Aug. 10, 1993

[51] Int. Cl.[6] .................... H01L 27/14; H01L 31/00
[52] U.S. Cl. .................................. 257/21; 257/22; 257/184; 257/187; 257/197; 257/462
[58] Field of Search ............... 257/17, 19, 21, 22, 257/184, 187, 197, 198, 431, 462, 464

[56] References Cited

U.S. PATENT DOCUMENTS

| | | | |
|---|---|---|---|
| 4,160,258 | 7/1979 | Dawson et al. | 257/80 |
| 5,003,366 | 3/1991 | Mishima et al. | 257/197 |
| 5,077,593 | 12/1991 | Sato et al. | 257/21 |

OTHER PUBLICATIONS

Chand, N., et al., "Gain of a Heterojunction Bipolar Transistor," IEEE Trans. Elec. Dev., vol. Ed-32, No. 3, Mar. 1985, pp. 622-626.

Karunasiri, R. P. G., "$Si_{1-x}Ge_x$/Si Multiple Quantum Well Infrared Detector" Appl. Phys., Lett., vol. 59, No. 20, Nov. 1991, pp. 2588-2590.

Primary Examiner—Sara W. Crane

[57] ABSTRACT

A long wavelength (6 to 20 μm) phototransistor is described which has n-doped silicon as emitter and collector regions bracketing a base region having a quantum well structure made up of alternating layers of p-doped silicon germanium and undoped silicon, The silicon germanium layer adjacent to the emitter region is thicker and has a higher percentage of germanium in order to provide a quantum well that is wider and deeper than the other quantum wells in the base region thereby resulting in a larger current and optical gain. The silicon barrier layer of the quantum well closest to the collector region is p-doped in order to reduce the leakage current of the base-collector junction.

7 Claims, 2 Drawing Sheets

1

PHOTOTRANSISTOR WITH QUANTUM WELL BASE STRUCTURE

BACKGROUND OF THE INVENTION

1. Field of the Invention

This invention relates to phototransistors and more particularly to phototransistors that are useful in the long wavelength infrared region, that is for wavelengths of about 6 to 20 micrometers.

2. Description of Related Art

Heterojunction bipolar phototransistors are well known as devices that can be used to produce an output electrical current in response to the presence of light. See, for example, the article entitled "Gain of a Heterojunction Bipolar Phototransistor" by Naresh Chand et al. in IEEE Transactions on Electron Devices, Vol ED-32, No. 3, March, 1985, pages 622–627. In the Chand et al. article, a phototransistor is described wherein the incident light passes through a transparent emitter and is absorbed in the base, the depletion region between the base and the collector, and the neutral collector. The electron-hole pairs generated in the depletion region and within the diffusion lengths of the minority carriers in the base and collector are separated and collected by the field of the base-collector junction leading to a current flow in an external circuit. The holes are swept into the base and are accumulated near the emitter-base junction due to a large potential barrier in the valence band at the heterointerface until they recombine with injected electrons from the emitter. To maintain the charge-neutrality condition in the base, a large injection of electrons occurs from the emitter into the base resulting in a large electron-current flow from the emitter to the collector. While phototransistors of the type in the Chand et al. article have provided greater gain than a simple photodiode, they have not provided a light detection that is useful in the infrared region of about 6 to 20 micrometers wavelength.

One form of a detector which is useful in the desired range of wavelengths is the quantum well infrared detector wherein p-doped $Si_{1-x}Ge_x$ layers are grown between undoped Si barrier layers in a quantum well structure in order to form multiple quantum wells primarily in the valence band, The term quantum well structure in this context refers to stacks of ultrathin layers of semiconductor material where the dimension of the ultrathin layer is sufficiently small such that the electron is considered to be essentially confined in that dimension by the energy barriers created by the differences in bandgaps. A description of this type of a photodetector can be found, for example, in the article entitled "$Si_{1-x}Ge_x$/Si multiple quantum well infrared detector", by R. P. G. Karunasiri et al., Applied Physics Letters, Vol. 59, No. 20, Nov. 11, 1991, pages 2588–2590. In detectors of the type described in the Karunasiri et al. article, the light excites holes within the quantum well to an extended miniband beyond the quantum well barriers formed by the Si layers, and the transport of holes in the quantum well region provides a current flow in an external circuit. Unfortunately, these quantum well detectors of the prior art have large leakage and large dark current due to the small heterojunction barriers and they therefor must be cooled typically to about 50° K. to reduce the dark current and Johnson noise. In addition these prior art devices have limited photoconductive gain.

SUMMARY OF THE INVENTION

A high gain, high detectivity long wavelength infrared photodetector with lower leakage and lower dark current is provided by the present invention wherein the base region of a phototransistor is constructed with a plurality of alternating layers of semiconductor material such that a quantum well structure is created in the base region with doping in the quantum wells giving them a conductivity opposite to that in the emitter and collector regions of the phototransistor. In order to reduce the minority carrier transit time for high optical gain, the semiconductor materials are chosen such that most of the bandgap discontinuity creating the quantum wells is in the valence band. Accordingly, efficient operation of the phototransistor is achieved since there is a lack of conduction band discontinuity and there is therefor no impediment to the transport of electrons in the conduction band.

It is a aspect of the present invention that the quantum well closest to the emitter-base junction of the transistor is constructed so as to be wider and deeper than the other quantum wells thereby providing higher hole confinement near the emitter-base junction and therefor increasing the current flow out of the emitter into the base region. It is an additional aspect of the present invention that the barrier layer between the last quantum well and the base-collector junction is doped with a material so as to produce a conductivity in this layer which is opposite to that in the collector region in order to reduce the leakage current of the base-collector junction.

DETAILED DESCRIPTION OF THE PREFERRED EMBODIMENT

Figure 1:
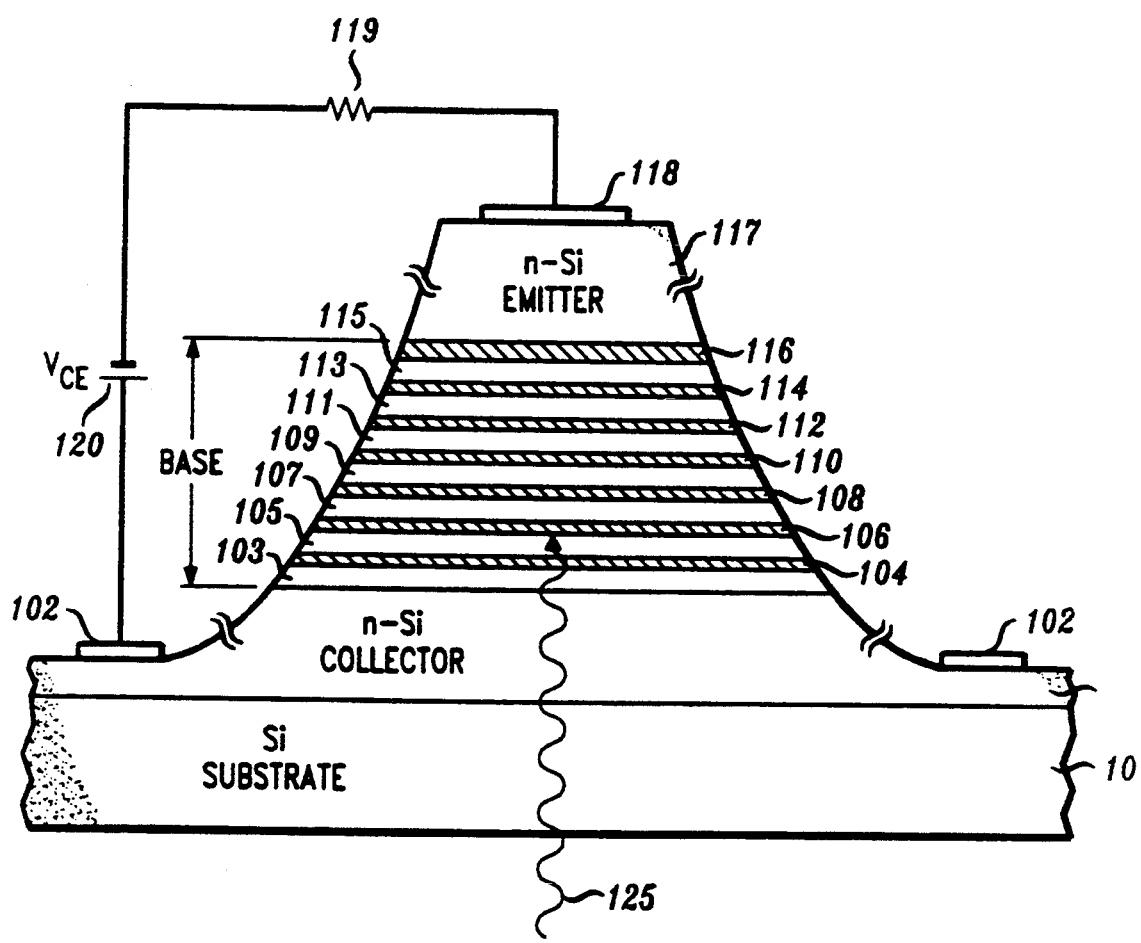
FIG. 1 is a cross-sectional diagram of a phototransistor constructed in accordance with the present invention.

The long wavelength infrared photodetector constructed in accordance with the present invention is essentially an npn transistor in which the base region consists of a quantum well structure constructed of alternating layers of silicon germanium ($Si_{1-x}Ge_x$) and silicon (Si). These alternating layers of SiGe and Si provide a sequence of quantum wells primarily in the valance band as described hereinafter in connection with FIG. 2. As shown in FIG. 1, the phototransistor is fabricated by first growing an approximately 1 μm (micrometer) thick Si layer 101 with n-type doping on a highly resistive Si substrate 100 to form the collector region of the phototransistor. This layer 101 is n-doped at a level of about $2 \times 10^{18}$ cm$^{-3}$ for the first 0.5 μm of growth and at a level of about $1 \times 10^{16}$ cm$^{-3}$ in the remaining 0.5 μm. Next a Si layer 103 with a p-type doping level of about $5 \times 10^{17}$ cm$^{-3}$ is grown to a thickness of about 300 Å onto layer 101. Layer 103 is p-doped in order to reduce the leakage current of the base-collector junction. Then a p-doped $Si_{1-x}Ge_x$ layer 104 is grown with a thickness of about 40 Å on layer 103 followed by an undoped Si layer 105. This process of alternately growing layers of $Si_{1-x}Ge_x$ followed by layers of undoped Si is then repeated to form layers 106–115 in FIG. 1. All of the undoped Si layers are grown with a thickness of about 300 Å, and the $Si_{1-x}$-$Ge_x$ layers described thus far are grown with thicknesses of about 40 Å and p-doped with levels of about $2 \times 10^{18}$ cm$^{-3}$, where the germanium mole fractions (x) are about 20 percent.

It should be noted that layer 103 may be eliminated, and layer 104 can be grown directly on collector layer 101 without departing from the spirit and scope of the present invention. Since layer 104 is also p-doped, it will also function so as to reduce the leakage current of the base-collector junction.

The final $Si_{1-x}Ge_x$ layer 116 is grown on layer 115 and is also p-doped to a level of about $2 \times 10^{18}$ cm$^{-3}$, but it is grown with a larger thickness of about 60 Å and a larger germanium mole fraction (x) of about 25 percent in order to provide a wider and deeper quantum well in the valance band than the quantum wells provided by the even-numbered layers 104 through 114. The effect of this wider and deeper quantum well will be more apparent after the discussion hereinafter in connection with FIG. 2.

Finally an n-doped layer 117 is grown on layer 116 to form the emitter region with n-type doping levels of about $2 \times 10^{17}$ cm$^{-3}$. The entire grown structure is then masked and etched so as to expose the collector layer 101 onto which a metallic contact 102 is deposited in order to provide a connection to the collector region. A metallic contact 118 is also deposited on layer 117 in order to provide a connection to the emitter region. Both layers 101 and 117 are much, much thicker than layers 103 through 116, and therefor only segments of layers 101 and 117 are shown in FIG. 1 to avoid misrepresenting their thicknesses relative to the layers in the base region. In addition, although the number of layers shown in the base region of FIG. 1 would only develop seven quantum wells, it should be apparent to those skilled in the art that other numbers of quantum wells are within the spirit and scope of the present invention. It is expected that the best mode of implementing the invention would involve the generation of about ten or more quantum wells.

Figure 2:
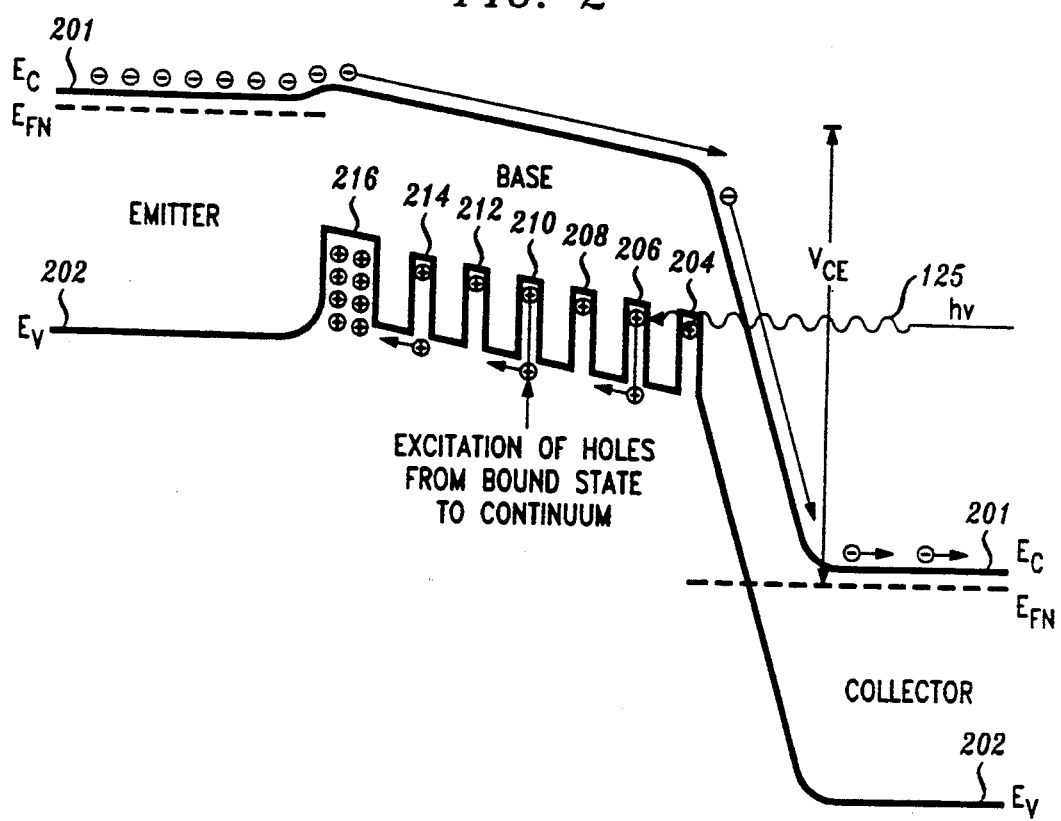
FIG. 2 is a representation of the relative conduction and valance band energies present in the phototransistor of FIG. 1 when the transistor is properly biased.

To bias and operate the phototransistor, an external power source 120 in FIG. 1 has its positive terminal directly connected to contact 102 and its negative terminal connected through a load impedance 119 to the contact 118. The infrared light beam to be detected, shown as 125 in FIG. 1, is coupled through the back of substrate 100 passing through the collector region into the base region which consists of layers 103 through 116. With the bias as indicated, the lower energy level of the conduction band, $E_c$, and the upper energy level of the valance band, $E_v$, are as shown in FIG. 2 by curves 201 and 202 respectively. As shown in FIG. 2, the bandgap differences between the Si and the $Si_{1-x}$-$Ge_x$ layers provide quantum wells primarily in the valance band, and the conduction band has essentially no discontinuity thereby permitting unimpeded transport of electrons in the base and therefor efficient operation of the transistor.

As further indicated in FIG. 2, the infrared light beam 125 is coupled through the collector region (layer 101) and through absorption excites a hole from a bound state in a SiGe quantum well either to a higher state within the well or to the continuum above the barriers provided by the odd-numbered Si layers 103-115. The quantum wells of FIG. 2 are designated by numbers which are identical to the layers which produce them except that the hundreds digit has been changed from one hundred in FIG. 1 to two hundred in FIG. 2. For example, the quantum well produced by layer 116 in FIG. 1 is designated as quantum well 216 in FIG. 2 and is shown as being wider and deeper than the other quantum wells. As a result, the holes which are excited drift and/or tunnel to the base-emitter junction and accumulate in quantum well 216 due to the large potential barrier in the valance band. To neutralize the accumulated holes, a large injection of electrons occurs from the emitter into the base region thereby resulting in a large current flow from the emitter to the collector which in turn results in larger current and optical gains. This increase in current flow resulting from light beam 125 produces an output signal in the form of a change in the potential drop across load impedance 119 of FIG. 1.

The device described hereinabove operates in a two-terminal mode. The holes lost due to recombination with minority carrier electrons will largely be replaced by injection of holes from the collector and by thermal generation in the base-collector depletion region. The most efficient method of replacing the lost holes would, however, be a small continuous wave or pulsed light bias whose wavelength should match the bandgap of the SiGe quantum well. Such a light bias will make the device equivalent to a three terminal device.

Any hole transfer from any quantum well to the quantum well next to the emitter-base junction would increase the forward bias, VBE, resulting in an increased electron injection and thus increased current flow. If the emitter efficiency is close to unity, the current gain, 13, is the ratio of the electron lifetime, $\tau T$, and the electron transit time, $\tau_t$, in the base:

$$\beta = \tau_T / \tau_t$$

Because of the diffusion and drift field in the base, the transit time is expected to be very small. If the quantum efficiency is $\eta$, the optical gain, g, will be as follows:

$$g = \eta \cdot \beta$$

The carrier multiplication in the base-collection depletion region can further increase the optical gain in accordance with the following equation:

$$g = \eta \cdot M(1+\beta)/(1-(M-1)\beta),$$

where M is the avalanche multiplication factor. If M in the last equation is slightly greater than unity, there will be a marked increase in current and optical gains. Note that this carrier multiplication also increases the dark current that will, however, not matter much if the dark current is much smaller than the photocurrent.

In the device described hereinabove, the holes are excited but the current transport in the base is through the electrons which occurs both by diffusion and drift. The device has a reversed biased p/n junction between the base and collector regions which causes the amount of leakage current to be much smaller than prior art quantum well devices which have no p/n junctions. The proposed device is accordingly expected to operate at relatively higher temperatures. Because the proposed photodetector has gain, the associated electronics can be reduced significantly. Furthermore, since the proposed photodetector is based on a silicon materials system, silicon electronics can be placed on the same substrate thereby resulting in less complex and more reliable circuits.

What is claimed is:

1. A phototransistor comprising emitter, base, collector regions, said emitter and collector regions being doped such that they are of the same conductivity type, said base region being doped such that it is the opposite conductivity type, and means for conductively coupling to said emitter and collector regions such that an output signal can be developed in response to an external light beam impinging on said phototransistor, characterized in that said base region comprises multiple layers of semiconductor material in a quantum well structure, the material in each layer being chosen such that the bandgap between its valance and conduction bands is different from the bandgap in adjacent layers and such that there is no substantial discontinuity in the conduction band between adjacent layers and the difference in bandgap between adjacent layers primarily causes discontinuities in the valance bands, whereby the quantum wells are primarily in the valance band.

2. A phototransistor as defined in claim 1 wherein the emitter and collector regions are n-doped silicon, and the multiple layers of said base region alternate between undoped silicon and p-doped SiGe.

3. A phototransistor as defined in claim 2 wherein the SiGe layer adjacent to said emitter region is thicker than the other SiGe layers in said base region and also has a higher percentage of germanium than the other SiGe layers, whereby the quantum well closest to said emitter layer is wider and deeper than the other quantum wells in said base region.

4. A phototransistor as defined in claims 2 or 3 wherein said base region further includes a p-doped silicon layer adjacent to said collector region.

5. A photodetector for developing an output signal in response to an external light beam, said photodetector comprising multiple layers of semiconductor material arranged to form a quantum well structure having a first layer and a last layer, the material of said multiple layers being chosen such that each layer has a bandgap between its valance and conduction bands different from the bandgap of adjacent layers thereby forming quantum wells in alternate layers with barrier layers between, said barrier layers being undoped and the alternate layers having the quantum wells being doped such that they are all of a first conductivity type, first means for conductively coupling to said first layer, and a second means for conductively coupling to said last layer, said output signal appearing between said first and second coupling means when said light beam impinges on said multiple layers, characterized in that said first and second coupling means includes semiconductor material having a dopant such that they are both of a conductivity type opposite to said first conductivity type, and said last layer of said quantum well structure is a layer having a quantum well, said last layer being thicker and having a smaller bandgap than the other layers having quantum wells.

6. A photodetector as defined in claim 5 wherein said first layer is a barrier layer and said first layer is doped such that it is said first conductivity type unlike the other barrier layers in said quantum well structure all of which are undoped.

7. A photodetector as defined in claims 5 or 6 wherein said quantum well structure includes alternating layers of p-doped silicon germanium and undoped silicon, and said first and second coupling means each include n-doped silicon.

* * * * *